(12) United States Patent
Abe et al.

(10) Patent No.: US 7,138,798 B1
(45) Date of Patent: Nov. 21, 2006

(54) AZIMUTH METER HAVING SPIN-VALVE GIANT MAGNETO-RESISTIVE ELEMENTS

(75) Inventors: Yasunori Abe, Mohka (JP); Kazuo Suzuki, Mohka (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 11/174,558

(22) Filed: Jul. 6, 2005

(30) Foreign Application Priority Data

Jul. 14, 2004 (JP) .............................. 2004-207009

(51) Int. Cl.
*G01R 33/02* (2006.01)
(52) U.S. Cl. ..................... 324/252; 324/249; 33/355 R
(58) Field of Classification Search ...................... None
See application file for complete search history.

(56) References Cited

U.S. PATENT DOCUMENTS

| 6,556,007 | B1 | 4/2003 | Abe et al. | |
|---|---|---|---|---|
| 2004/0104724 | A1* | 6/2004 | Sato | ............................ 324/224 |
| 2004/0189295 | A1* | 9/2004 | Sato et al. | ................... 324/252 |

* cited by examiner

*Primary Examiner*—Bot Ledynh
(74) *Attorney, Agent, or Firm*—Sughrue Mion, PLLC

(57) ABSTRACT

An azimuth meter using spin-valve giant magneto-resistive elements, which is simple in manufacturing process, can be made compact in size and contribute to power saving, is disclosed. The azimuth meter comprises a quadrilateral plane coil having two pairs of parallel opposed sides and four spin-valve giant magneto-resistive element pairs, each pair of the elements disposed on a plane parallel to the coil. The longitudinal directions of two elements of each pair orthogonally cross each other, and cross only a respective side or only the same side of a pair of the opposed sides of the plane coil at substantially 45 degrees. The pinned layer of one of the two elements is magnetized in its longitudinal direction, and that of the other element is magnetized in the same direction as the pinned layer of that one element. The paired elements are connected to each other at one end. While a voltage for measurement is being applied between the other ends, a midpoint potential is taken out of the ends of the elements connected to each other to determine an azimuth.

9 Claims, 8 Drawing Sheets

AZIMUTH METER HAVING SPIN-VALVE GIANT MAGNETO-RESISTIVE ELEMENTS

BACKGROUND OF THE INVENTION

1. Field of the Invention

The present invention relates to an azimuth meter using spin-valve giant magneto-resistive elements, and more particularly to an azimuth meter which measures the azimuth while applying bias magnetic fields to spin-valve giant magneto-resistive elements.

2. Description of the Related Art

The present applicant already applied for a patent on an azimuth meter combining anisotropic magneto-resistive elements with a plane coil, and the application was registered as U.S. Pat. No. 6,556,007. The azimuth meter disclosed in U.S. Pat. No. 6,556,007 has a substantially square plane coil 1 and eight magneto-resistive elements 61, 62, 71, 72, 81, 82, 91 and 92 on a plane parallel and close to the plane coil as shown in the exploded perspective view of FIG. 14. Two of the magneto-resistive elements (e.g. 61 and 72) cross one side (e.g. 11) of the plane coil and the longitudinal direction of those magneto-resistive elements at substantially 45°, and the longitudinal direction of those two magneto-resistive elements are at a right angle to each other. Two magneto-resistive elements (e.g. 61 and 62 or 71 and 72) each of which crosses each of two opposed sides (e.g. 11 and 12) of the plane coil and which longitudinal directions form a right angle with each other constitute magneto-resistive element pairs 6, 7, 8 and 9. One end of each element of paired magneto-resistive elements (e.g. 6) is connected to that of the other element, and a voltage Vcc for measurement is applied between the other ends of the paired magneto-resistive elements (e.g. 6). While a biasing magnetic field is being applied by the plane coil to the magneto-resistive element pair, intermediate potential outputs of the magneto-resistive element pair are taken out from their connected ends of the magneto-resistive element pairs 6, 7, 8 and 9. An intermediate potential output difference Vx is figured out between the two magneto-resistive element pairs 6 and 7 crossing the two opposite sides 11 and 12 of the plane coil 1. An intermediate potential output difference Vy between the two other magneto-resistive element pairs 8 and 9 crossing the two other opposite sides 13 and 14 of the plane coil 1 is also figured out in a similar way. Next, while biasing magnetic fields in the reverse direction are being applied by the plane coil 1 to the magneto-resistive element pairs 6, 7, 8 and 9, similarly an intermediate potential output difference Vx of the two pairs 6 and 7 of the magneto-resistive elements crossing the two opposite sides 11 and 12 of the plane coil 1 is figured out. An intermediate potential output difference Vy between the two other magneto-resistive element pairs 8 and 9 crossing the two other opposite sides 13 and 14 of the plane coil 1 is figured out in a similar way. Then, with respect to the two magneto-resistive element pairs 6 and 7 crossing one pair of opposite sides 11 and 12 of the plane coil, the differential voltage is figured out between the intermediate potential output difference Vx earlier obtained while a biasing magnetic field was being applied and the other intermediate potential output difference Vx obtained while a biasing magnetic field was being applied in the reverse direction. Also with respect to the two magneto-resistive element pairs 8 and 9 crossing the two other opposite sides 13 and 14 of the plane coil, the differential voltage is figured out between the intermediate potential output difference Vy obtained while a biasing magnetic field was being applied and the other intermediate potential output difference Vy obtained while a biasing magnetic field was being applied in the reverse direction. The direction of an external magnetic field (e.g. earth magnetism) can be figured out from the ratio between these two differential voltages.

The resistance of a magneto-resistive element to an electric current varies with the intensity of a magnetic field applied in a direction at a right angle to the flowing direction of the current, and decreases with an increase in the intensity of the magnetic field at right angle to the current. For use in an azimuth meter, it is desirable for individual magneto-resistive elements to be substantially equal in the rate of resistance variation, and for this reason crystallomagnetic anisotropy is provided in the longitudinal direction to each magneto-resistive element of the azimuth meter described above.

In the azimuth meter disclosed in U.S. Pat. No. 6,556,007, as shown in FIG. 14, the respective longitudinal directions of the four magneto-resistive elements 61, 71, 81 and 91 and those of the other four magneto-resistive elements 62, 72, 82 and 92 are perpendicular to each other. In order to provide crystallomagnetic anisotropy to these eight magneto-resistive elements in their respective longitudinal direction, it is necessary to form the four magneto-resistive elements 61, 71, 81 and 91 in the same direction while applying magnetic fields to their longitudinal direction and, after that, to form the other four magneto-resistive elements 62, 72, 82 and 92 perpendicular thereto while applying magnetic fields to their longitudinal direction.

Moreover, since external magnetic fields (earth magnetism and the like) working in the widthwise direction of the magneto-resistive elements have to be detected, if the dimension in the widthwise direction is reduced, the influence of the demagnetizing field will increase to reduce sensitivity in measuring weak magnetic fields, such as earth magnetism. This necessitates relatively wide magneto-resistive elements, but wider magneto-resistive elements are less resistant, inviting greater power consumption in applying a voltage for measurement to the magneto-resistive element pairs. For this reason, the magneto-resistive elements should be elongated to increase their resistances, but wider and longer magneto-resistive elements would be correspondingly greater square measure, making it necessary to increase the size of the azimuth meter.

SUMMARY OF THE INVENTION

The present invention, therefore, is intended to provide an azimuth meter using spin-valve giant magneto-resistive elements representing a solution to the problems noted above.

An azimuth meter according to the invention comprises a plane coil having two pairs of opposed sides which are at least partially parallel to each other, the pairs being perpendicular to each other, and two pairs, per pair of the opposed sides of the plane coil, of spin-valve giant magneto-resistive elements. The spin-valve giant magneto-resistive elements are positioned on the same side of a plane of the plane coil and on a plane parallel and close to the plane of the plane coil. Each of the spin-valve giant magneto-resistive elements is a multi-layered thin film formed by sandwiching a nonmagnetic layer between a pinned layer made of a ferromagnetic substance magnetically coupled with an antiferromagnetic layer made of an antiferromagnetic substance and a free layer made of a ferromagnetic substance, the multi-layered thin film having a shape whose widthwise dimension is sufficiently small relative to a longitudinal dimension thereof. A longitudinal direction of one spin-valve giant magneto-resistive element of each pair of the spin-valve giant magneto-resistive elements and that of the other spin-valve giant magneto-resistive element of the pair orthogonally cross each other, the pinned layer of the one spin-valve giant magneto-resistive element is magnetized in its longitudinal direction and the pinned layer of the other spin-valve giant magneto-resistive element is magnetized in the same direction as the pinned layer of the one spin-valve giant magneto-resistive element. The longitudinal directions of the two spin-valve giant magneto-resistive elements constituting each pair of spin-valve giant magneto-resistive elements cross only a respective side or only the same side of the pair of the opposite sides of the plane coil at substantially 45 degrees. The two spin-valve giant magneto-resistive elements of each pair of spin-valve giant magneto-resistive elements are connected to each other at one end of each of the two spin-valve giant magneto-resistive elements, and a voltage for measurement is applied between the other ends of the same to enable a midpoint potential to be taken out of the one end.

The longitudinal directions of the two spin-valve giant magneto-resistive elements constituting each pair of the spin-valve giant magneto-resistive element pairs may cross only the same side of the pair of the opposed sides of the plane coil. Or the longitudinal directions of the two spin-valve giant magneto-resistive elements constituting the pair of the spin-valve giant magneto-resistive element pairs each may cross only a respective side of the pair of opposed sides of the plane coil.

It is preferable for the azimuth meter according to the invention further to have a power source to supply the plane coil with a sufficient DC current to apply DC magnetic fields of such a magnitude as to saturate a magnetization of the free layers of the spin-valve giant magneto-resistive elements in the longitudinal direction, and to supply the plane coil with a DC current to apply to the spin-valve giant magneto-resistive elements DC magnetic fields of a predetermined magnitude smaller than the DC magnetic fields for saturation.

It is preferable for the azimuth meter according to the invention further to have an arithmetic unit, which extracts a difference in midpoint potential between two pairs of spin-valve giant magneto-resistive elements crossing one pair of the opposed sides of the plane coil and a difference in midpoint potential between two pairs of spin-valve giant magneto-resistive elements crossing the other pair of opposed sides while the DC magnetic fields of the predetermined magnitude are being applied to the spin-valve giant magneto-resistive elements, and determines an azimuth of an external magnetic field on the basis of the two differences in midpoint potential.

The azimuth meter according to the invention using spin-valve giant magneto-resistive elements, since every one of its pinned layers magnetized in the same direction, it can be readily made anisotropic, which means a simplified manufacturing process and easier manufacturing.

Also, since the magnetizing direction of the free layers are controlled with a biasing magnetic field deriving from a coil, there is no need to use a permanent magnet, which would otherwise disturb weak magnetic fields to be measured.

Furthermore, the spin-valve giant magneto-resistive elements are more resistant than anisotropic magneto-resistive elements or isotropic giant magneto-resistive elements, and accordingly the elements can be reduced in size, contributing to power saving.

Moreover, since spin-valve giant magneto-resistive elements are less susceptible to a sensitivity drop, even if reduced in size, than anisotropic magneto-resistive elements and isotropic giant magneto-resistive elements, they can be fabricated more compactly.

The azimuth meter according to the invention has these advantages, and moreover can measure the direction in which an external magnetic field is applied.

It can as well be used as an angle sensor for measuring the angle formed between the direction of a magnetic field generated by a magnetic field source other than earth magnetism and the direction of the sensing axis of a spin-valve giant magneto-resistive element.

DETAILED DESCRIPTION OF THE PREFERRED EMBODIMENTS

EXAMPLE 1

Figure 1:
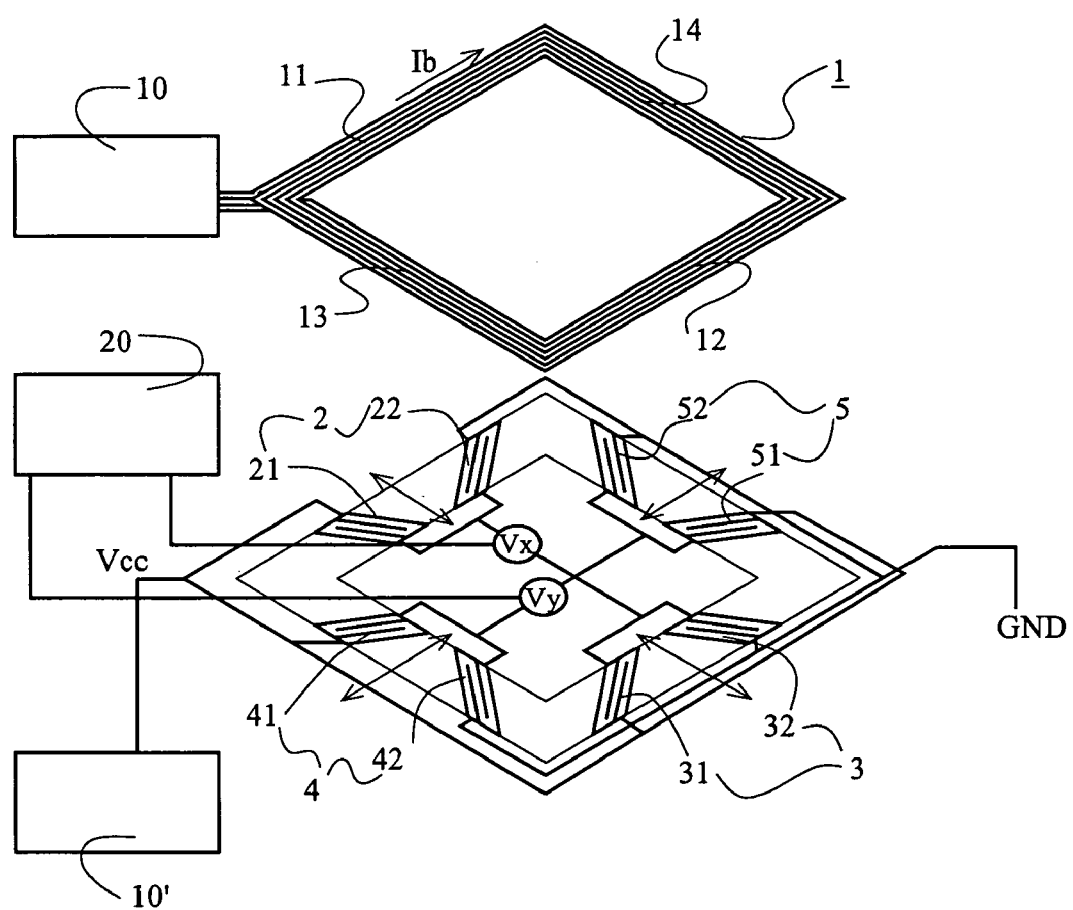
FIG. 1 is an exploded perspective view of an azimuth meter of EXAMPLE 1 of the present invention.
Figure 2:
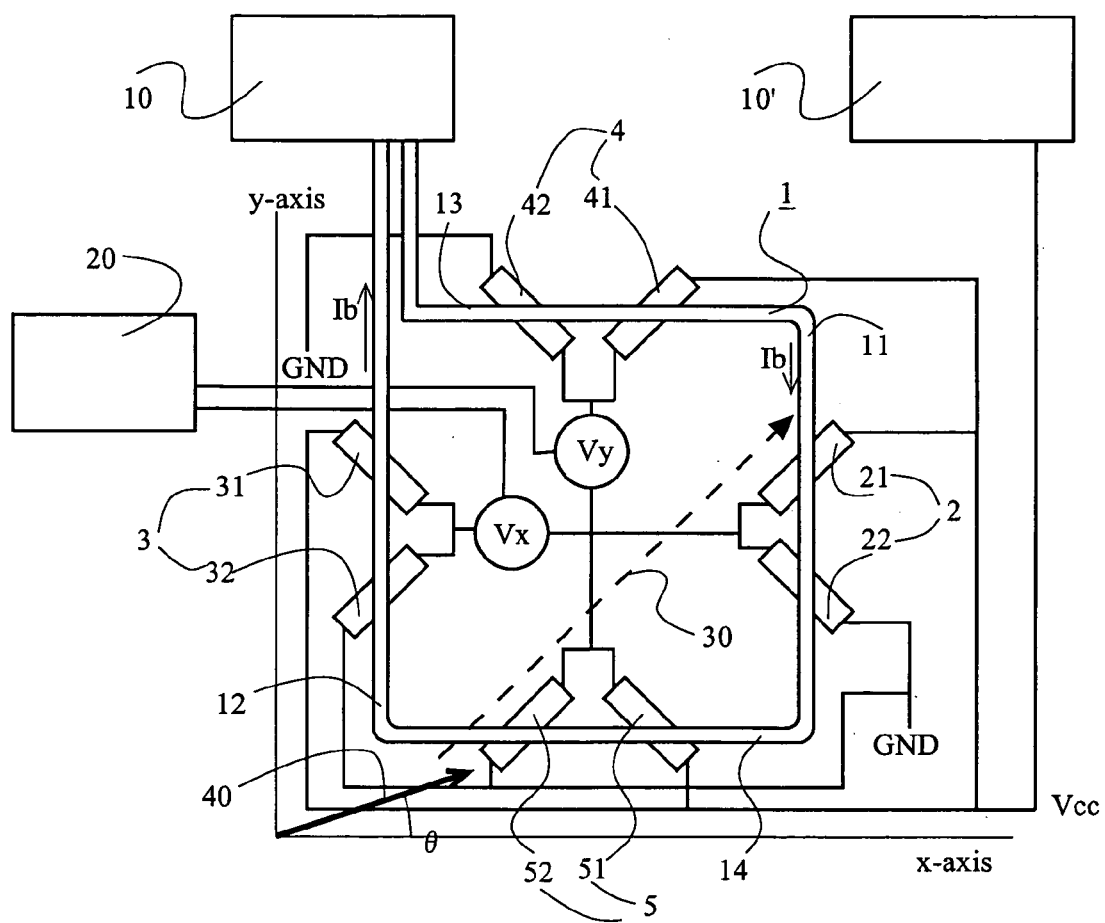
FIG. 2 is a circuit diagram of the azimuth meter of EXAMPLE 1 of the invention.

An exploded perspective view of an azimuth meter of EXAMPLE 1 of the present invention is shown in FIG. 1, and its circuit diagram, in FIG. 2. In FIG. 1 and FIG. 2, reference numeral 1 denotes a parallelogrammatic (square in the illustration) plane coil, which is wound a few tens of rounds. The plane coil 1 has a pair of parallel opposite sides 11 and 12 and another pair of parallel opposite sides 13 and 14, and these pairs of opposite sides are perpendicular to each other. As the plane coil in this example is square, the opposite sides in each pair are fully parallel to each other. However, according to the invention, it is sufficient for the opposite sides in each pair to be at least partially parallel. If these sides of the coil are parallel to each other where they cross spin-valve giant magneto-resistive elements, the magnetic fields generated from the sides of the coil will be in mutually reverse directions along the same line. A power supply source 10 for supplying a DC current to the plane coil 1 is connected to terminals of the plane coil 1. Four pairs 2, 3, 4 and 5 of spin-valve giant magneto-resistive elements are provided on the same side on a plane of the plane coil, on the lower side in these drawings, in a plane parallel and close to the plane of the plane coil. Each of the pairs 2, 3, 4 and 5 of spin-valve giant magneto-resistive elements consists of two spin-valve giant magneto-resistive elements 21 and 22, 31 and 32, 41 and 42 or 51 and 52.

The longitudinal direction of one spin-valve giant magneto-resistive element 21 of the spin-valve giant magneto-resistive element pair 2 crosses only a side 11 of the plane coil 1 at substantially 45 degrees. The longitudinal direction of the other spin-valve giant magneto-resistive element 22 of the spin-valve giant magneto-resistive element pair 2 also crosses only the same side 11 of the plane coil 1 at substantially 45 degrees. These spin-valve giant magneto-resistive elements 21 and 22 are connected to each other at one end (respective end inside the plane coil 1 in this embodiment). Also, the longitudinal direction of each one spin-valve giant magneto-resistive element 31, 41 and 51 and that of the other spin-valve giant magneto-resistive element 32, 42 and 52 of each pair of the spin-valve giant magneto-resistive element pairs 3, 4 and 5 cross only the sides 12, 13 and 14 of the plane coil 1 at substantially 45 degrees. The spin-valve giant magneto-resistive elements 31 and 32 are connected to each other at one end of each of the elements (respective end inside the plane coil 1 in this embodiment); the spin-valve giant magneto-resistive elements 41 and 42 are connected to each other at one end of each of the elements (respective end inside the plane coil 1 in this embodiment), and the spin-valve giant magneto-resistive elements 51 and 52 are connected to each other at one end of each of the elements (respective end inside the plane coil 1 in this embodiment). A voltage Vcc for measurement is applied between the other ends of the spin-valve giant magneto-resistive element pairs 2, 3, 4 and 5. The voltage Vcc for measurement can be supplied from a power supply source 10'. There is also provided an arithmetic unit 20, which extracts an output from the connected ends of the two spin-valve giant magneto-resistive elements of the spin-valve giant magneto-resistive element pairs and converts the extracted output into a direction of a magnetic field to be measured (angle θ).

Each spin-valve giant magneto-resistive element, as will be described in detail afterwards, is a multi-layered thin film formed by sandwiching a nonmagnetic layer, such as a Cu layer, between a pinned layer formed of a ferromagnetic substance magnetically coupled with an antiferromagnetic layer consisting of an antiferromagnetic substance and a free layer consisting of a ferromagnetic substance. The magnetization of the pinned layer is fixed in one direction by the antiferromagnetic layer disposed adjacent to the pinned layer. The magnetization of the free layer, though in the same direction as that of the pinned layer in a state in which no external magnetic field is applied, is determined by shape anisotropy arising from the shape of the multi-layered thin film of the spin-valve giant magneto-resistive elements and any external magnetic field that is applied. Since the width of the multi-layered thin film of the spin-valve giant magneto-resistive element is sufficiently small relative to its size in the longitudinal direction and the longitudinal direction is made an axis of easy magnetization by the shape anisotropy, the magnetization of the free layer is in the longitudinal direction in a state in which no external magnetic field is applied.

The longitudinal directions of one spin-valve giant magneto-resistive element and of the other of each spin-valve giant magneto-resistive element pair cross each other orthogonally. In each of the spin-valve giant magneto-resistive element pairs of EXAMPLE 1 shown in FIG. 2, the longitudinal directions of the two spin-valve giant magneto-resistive elements 21 and 22 of the spin-valve giant magneto-resistive element pair 2 cross each other orthogonally; the longitudinal directions of the two spin-valve giant magneto-resistive elements 31 and 32 of the spin-valve giant magneto-resistive element pair 3 cross each other orthogonally, and so do the longitudinal directions of the two spin-valve giant magneto-resistive elements 41 and 42 of the spin-valve giant magneto-resistive element pair 4 and the longitudinal directions of the two spin-valve giant magneto-resistive elements 51 and 52 of the spin-valve giant magneto-resistive element pair 5.

What is indicated by a broken arrow 30 in FIG. 2 is the direction of magnetization of the antiferromagnetic layer of each spin-valve giant magneto-resistive element. The magnetization of the pinned layer of each spin-valve giant magneto-resistive element is fixed in that direction. The pinned layer of one spin-valve giant magneto-resistive element 21 of the spin-valve giant magneto-resistive element pair 2 is magnetized in its longitudinal direction, and that of the other spin-valve giant magneto-resistive element 22 is magnetized in its widthwise direction. The pinned layer of one spin-valve giant magneto-resistive element 32 of the spin-valve giant magneto-resistive element pair 3 is magnetized in its longitudinal direction, and that of the other spin-valve giant magneto-resistive element 31 is magnetized in its widthwise direction. The pinned layer of one spin-valve giant magneto-resistive element 41 of the spin-valve giant magneto-resistive element pair 4 is magnetized in its longitudinal direction, and that of the other spin-valve giant magneto-resistive element 42 is magnetized in its widthwise direction. The pinned layer of one spin-valve giant magneto-resistive element 52 of the spin-valve giant magneto-resistive element pair 5 is magnetized in its longitudinal direction, and that of the other spin-valve giant magneto-resistive element 51 is magnetized in its widthwise direction. Thus, it can be said that the pinned layer of one spin-valve giant magneto-resistive element of any spin-valve giant magneto-resistive element pair is magnetized in its longitudinal direction, and that of the other spin-valve giant magneto-resistive element of the pair is magnetized in the same direction as the pinned layer of the one spin-valve giant magneto-resistive element.

The azimuth meter of this EXAMPLE has a configuration in which spin-valve giant magneto-resistive elements are formed on a substrate and, in turn, a plane coil is formed on them. The substrate is of 0.625 mm thick. Thin film consisting of the spin-valve giant magneto-resistive elements and the plane coil formed on the substrate is of 10 to 20 μm thick. The substrate measures 1.6 mm×1.75 mm.

As can be understood from FIG. 1 and FIG. 2, when a DC current is let flow into the plane coil 1, DC magnetic fields are generated on planes parallel to the plane of the plane coil from inside to outside or from outside to inside of the coil. Therefore, as indicated by arrows in FIG. 1, DC magnetic fields are applied to the spin-valve giant magneto-resistive element pairs. When a clockwise DC current Ib is let flow in the plane coil 1 as viewed in FIG. 2, a magnetic field in the x direction is applied to the spin-valve giant magneto-resistive elements 21 and 22, a magnetic field in the −x direction to the spin-valve giant magneto-resistive elements 31 and 32, and a magnetic field in the y direction to the spin-valve giant magneto-resistive elements 41 and 42, and a magnetic field in the −y direction to the spin-valve giant magneto-resistive elements 51 and 52. When a DC current −Ib in the reverse direction is let flow in the plane coil 1, magnetic fields in the directions reverse to the above-stated are applied to the spin-valve giant magneto-resistive elements. The plane on which the spin-valve giant magneto-resistive elements are formed is in a position from the plane coil where magnetic fields generated from the plane coil can well be applied to the spin-valve giant magneto-resistive elements.

Figure 3:
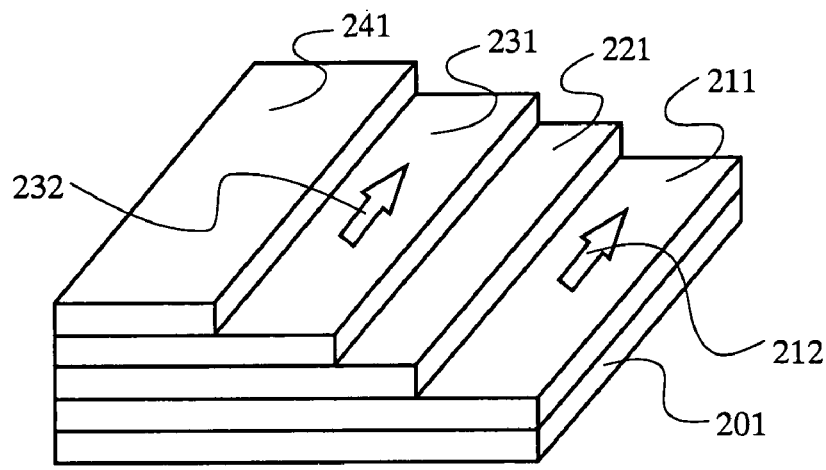
FIG. 3 is an explanatory perspective view showing a cut sample of a spin-valve giant magneto-resistive element for use in the invention.

Each of the spin-valve giant magneto-resistive element is a multi-layered thin film formed by sandwiching a nonmagnetic layer between a pinned layer formed of a ferromagnetic substance and a free layer consisting of a ferromagnetic substance, with an antiferromagnetic layer being laminated adjacent over the pinned layer, and the width of the thin film is sufficiently small relative to the size in its longitudinal direction. A spin-valve giant magneto-resistive element that can be used, for instance, would consist of an $Al_2O_3$ film of 85 nm and a Ta film of 5 nm in thickness, constituting a base film laid over a Si substrate, a ferromagnetic substance layer consisting of an NiFe alloy film of 5.0 nm and a CoFe alloy of 1.0 nm in thickness, a Cu layer (nonmagnetic layer) of 2.3 nm in thickness, another ferromagnetic substance layer consisting of a CoFe alloy of 2.5 nm in thickness, and an antiferromagnetic layer consisting of an MnPt alloy of 20 nm in thickness, laid one over another in this order. FIG. 3 is an explanatory perspective view showing a cut sample of a spin-valve giant magneto-resistive element, wherein reference numeral 201 denotes a base layer of a Ta film of 5 nm in thickness. Over the base layer, a free layer 211 consisting of an NiFe alloy film and a CoFe alloy and a nonmagnetic layer 221 consisting of a Cu layer are laid. Over them, a ferromagnetic pinned layer 231 of a CoFe alloy and an antiferromagnetic layer 241 are further laid.

It is supposed now that the magnetization of the pinned layer 231 made of a ferromagnetic substance is turned by the antiferromagnetic layer 241 in the direction indicated by arrow 232. In a state in which no external magnetic field is applied, the magnetization of the free layer 211 heads in the direction indicated by arrow 212, and the magnetization direction 212 of the free layer 211 and the magnetization direction 232 of the pinned layer 231 are in parallel to each other with the nonmagnetic layer 221 interposed therebetween. When magnetization directions in such adjoining ferromagnetic substance layers are parallel to each other, an electric resistance of a current in the nonmagnetic layer 221 sandwiched between these ferromagnetic substance layers is at its lowest. When any external magnetic field is applied to cause the magnetization direction in the free layer 211 to turn and the magnetization directions of the ferromagnetic substance layers on both sides of the nonmagnetic layer 221 to deviate from the same direction, the electric resistance to the current increases.

Figure 4:
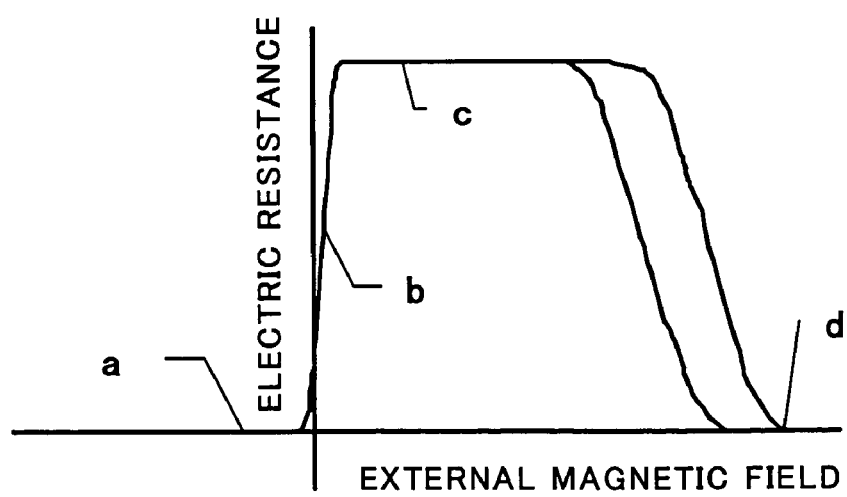
FIG. 4 is a graph showing a general relationship between an electric resistance and an external magnetic field of spin-valve giant magneto-resistive elements.

FIG. 4 is a graph showing an electric resistance to an electric current flowing in the nonmagnetic layer with the axis of ordinates representing the electric resistance. The axis of abscissas represents the intensity of an external magnetic field working in the direction reverse to the magnetization of the pinned layer. When no external magnetic field is applied or the direction in which the external magnetic field is applied is in the same direction as the magnetization of the pinned layer, the resistance is at its lowest, position "a" in the graph of FIG. 4. When the external magnetic field is applied in the direction reverse to the magnetization of the pinned layer, as the magnetization of the free layer turns its direction to become perpendicular to the magnetization of the pinned layer, the resistance reaches position "b" in the graph of FIG. 4. The external magnetic field working in the direction reverse to the magnetization of the pinned layer increases in intensity, and when the magnetization of the free layer becomes antiparallel to the magnetization of the pinned layer, the resistance reaches its highest, position "c" in the graph of FIG. 4. When the external magnetic field further increases in intensity and the magnetization of the pinned layer takes in the same direction as the external magnetic field, as the magnetization of the pinned layer becomes parallel to that of the free layer, the resistance falls to position "d" in the graph of FIG. 4. Then, when the external magnetic field decreases in intensity, the resistance varies in a sequence of d→c→b→a, but the loop is delayed behind the loop which was followed when the magnetization increased, because the turning of the magnetization of the pinned layer has a great hysteresis. Since external magnetic fields to be measured with the azimuth meter according to the invention are not so intense, the region of "b" between "a" and "c" is used for measuring the directions of the magnetic fields.

The resistance of each spin-valve giant magneto-resistive element will be described when an external magnetic field 40 is applied to the azimuth meter of EXAMPLE 1 shown in FIG. 2 in a direction at an angle θ from the x axis. A large current DC is caused to flow through the plane coil 1 clockwise in advance, and magnetic fields of such a magnitude as to saturate the spin-valve giant magneto-resistive elements in the external direction are applied to cause the magnetization of the free layer of every spin-valve giant magneto-resistive element to proceed from inside to outside of the plane coil in the longitudinal directions of the spin-valve giant magneto-resistive elements. Since each spin-valve giant magneto-resistive element is sufficiently small in widthwise dimension relative to its size in the longitudinal direction, its shape magnetic anisotropy is strong, and the magnetization directions of the free layer are aligned to the longitudinal when external magnetic fields are weakened.

In the spin-valve giant magneto-resistive element 21 of the spin-valve giant magneto-resistive element pair 2, since the magnetization of its pinned layer is fixed by an antiferromatic layer in the direction of broken arrow 30, it is outward in the longitudinal direction of the spin-valve giant magneto-resistive element 21. The magnetization of the free layer of the spin-valve giant magneto-resistive element 21 is turned outward in the longitudinal direction by applying in advance a magnetic field in the outward of the plane coil. Since the magnetization direction of the pinned layer and that of the free layer are parallel, the resistance of the spin-valve giant magneto-resistive element 21 is in position "a" in FIG. 4. As the flow of a biasing DC current Ib of an appropriate amperage through the plane coil 1 clockwise causes a DC magnetic field to be applied to the spin-valve giant magneto-resistive element 21 in the direction of the x axis, the magnetization of the free layer inclines toward the direction of that DC magnetic field, and therefore its resistance slightly rises from position "a" toward position "b" in FIG. 4. The biasing DC current Ib is so selected that the resistance take on an appropriate level between positions "a" and "c" in the graph of FIG. 4.

The pinned layer of the spin-valve giant magneto-resistive element 22 of the spin-valve giant magneto-resistive element pair 2 is magnetized outward in the widthwise direction of the spin-valve giant magneto-resistive element 22. The free layer of the spin-valve giant magneto-resistive element 22 is magnetized outward in the longitudinal direction by applying a magnetic field in the outward of the plane coil in advance. Since the magnetization direction of the pinned layer and that of the free layer are perpendicular to each other, the resistance of the spin-valve giant magneto-resistive element 22 is in position "b" in FIG. 4. As the flow of a biasing DC current Ib of an appropriate amperage through the plane coil 1 clockwise causes a DC magnetic field to be applied to the spin-valve giant magneto-resistive element 22 in the direction of the x axis, the magnetization of the free layer inclines toward the direction of that DC magnetic field, and therefore its resistance slightly falls from position "b" toward position "a" in the graph of FIG.4.

Figure 5:
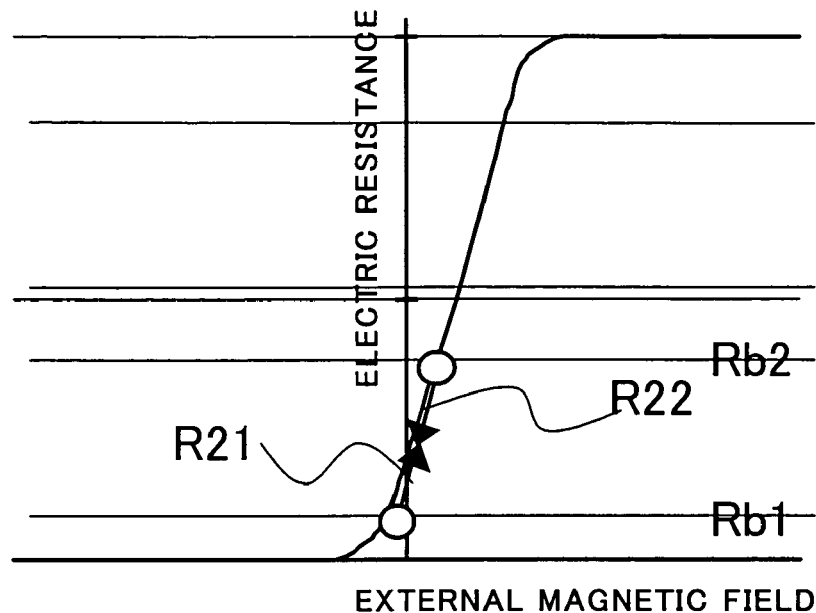
FIG. 5 is a graph showing the relationship between an electric resistance and an external magnetic field in the x axis direction of two spin-valve giant magneto-resistive elements in EXAMPLE 1.
Figure 6:
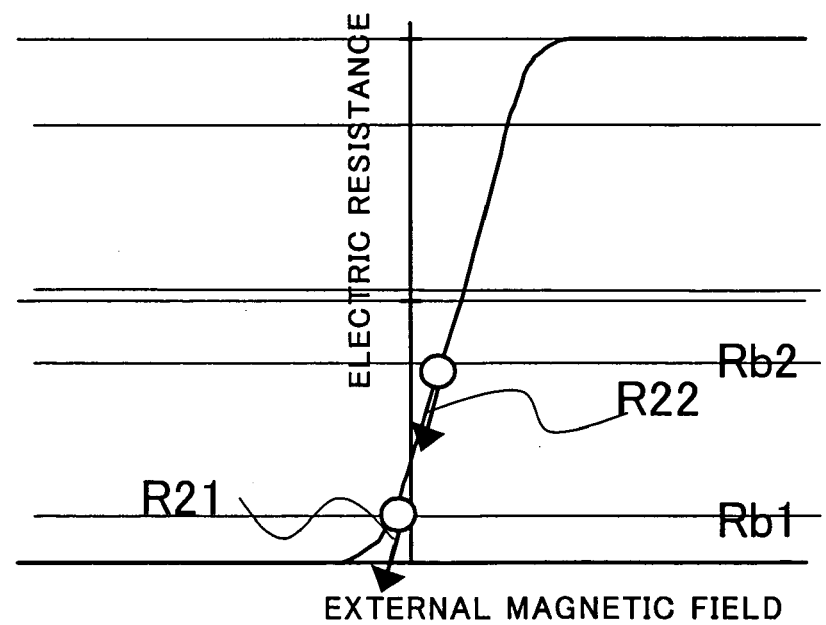
FIG. 6 is a graph showing the relationship between an electric resistance and an external magnetic field in the y axis direction of two spin-valve giant magneto-resistive elements in EXAMPLE 1.

FIG. 5 is a graph showing the relationship of a resistance R21 of the spin-valve giant magneto-resistive element 21 and a resistance R22 of the spin-valve giant magneto-resistive element 22 to an external magnetic field intensity in the x axis direction. FIG. 6 is a graph showing the relationship of a resistance R21 of the spin-valve giant magneto-resistive element 21 and a resistance R22 of the spin-valve giant magneto-resistive element 22 to an external magnetic field intensity in the y axis direction. FIG. 5 and FIG. 6 show the resistance R21 of the spin-valve giant magneto-resistive element 21 as a resistance Rb1 at the time of applying a biasing magnetic field and the resistance R22 of the spin-valve giant magneto-resistive element 22 as a resistance Rb2 at the time of applying a biasing magnetic field. When an external magnetic field 40 of an intensity He is applied to the spin-valve giant magneto-resistive element 21 and the spin-valve giant magneto-resistive element 22 at an angle θ from the x axis, the x component (He·cosθ) of the external magnetic field 40 causes the resistance R21 of the spin-valve giant magneto-resistive element 21 to increase, with the result that the resistance R21 varies from Rb1 as shown in FIG. 5. As the y component (He sinθ) of the external magnetic field 40 causes the resistance R21 of the spin-valve giant magneto-resistive element 21 to decrease, the resistance R21 varies from Rb1 as shown in FIG. 6. As the x component (He·cosθ) of the external magnetic field 40 causes the resistance R22 of the spin-valve giant magneto-resistive element 22 to decreases, the resistance R22 varies from Rb2 as shown in FIG. 5, and as the y component (He·sinθ) of the external magnetic field 40 causes the resistance R22 of the spin-valve giant magneto-resistive element 22 to decrease, the resistance R22 varies from Rb2 as shown in FIG. 6.

To sum up the foregoing, the resistance R21 of the spin-valve giant magneto-resistive element 21 and the resistance R22 of the spin-valve giant magneto-resistive element 22 can be expressed in the following equations, respectively:

$$R21 = Rb1 + \beta \cdot He \cdot \cos\theta - \beta \cdot He \cdot \sin\theta \quad (1)$$

$$R22 = Rb2 - \beta \cdot He \cdot \cos\theta - \beta \cdot He \cdot \sin\theta \quad (2)$$

where β is a gradient (dR/dH) of the graph of FIG. 4.

As the magnetization of the pinned layer of the spin-valve giant magneto-resistive element 32 of the spin-valve giant magneto-resistive element pair 3 is fixed by an antiferromagnetic layer in the direction of broken arrow 30, it is inward in the longitudinal direction of the spin-valve giant magneto-resistive element 32. The free layer of the spin-valve giant magneto-resistive element 32 is magnetized outward in the longitudinal direction by applying an outward magnetic field by the plane coil in advance. Since the magnetization of the pinned layer is antiparallel to the magnetization of the free layer, the resistance of the spin-valve giant magneto-resistive elements 32 is in position "c" in FIG. 4. As the flow of a biasing DC current Ib of an appropriate amperage through the plane coil 1 clockwise causes a DC magnetic field to be applied to the spin-valve giant magneto-resistive element 32 in the direction of the –x axis, the magnetization of the free layer inclines toward the direction of that DC magnetic field, and therefore its resistance slightly falls from position "c" toward position "b" in the graph of FIG. 4.

The magnetization of the pinned layer of the spin-valve giant magneto-resistive element 31 of the spin-valve giant magneto-resistive element pair 3 is inward in the widthwise direction of the spin-valve giant magneto-resistive element 31. The free layer of the spin-valve giant magneto-resistive element 31 is magnetized outward in the longitudinal direction by applying an outward magnetic field by the plane coil in advance. Since the magnetization direction of the pinned layer and that of the free layer are perpendicular to each other, the resistance of the spin-valve giant magneto-resistive element 31 is in position "b" in FIG. 4. As the flow of a biasing DC current Ib of an appropriate amperage through the plane coil 1 clockwise causes a DC magnetic field to be applied to the spin-valve giant magneto-resistive element 31 in the direction of the –x axis, the magnetization of the free layer inclines toward the direction of that DC magnetic field, and therefore its resistance slightly rises from position "b" toward position "c" in the graph of FIG. 4.

Figure 7:
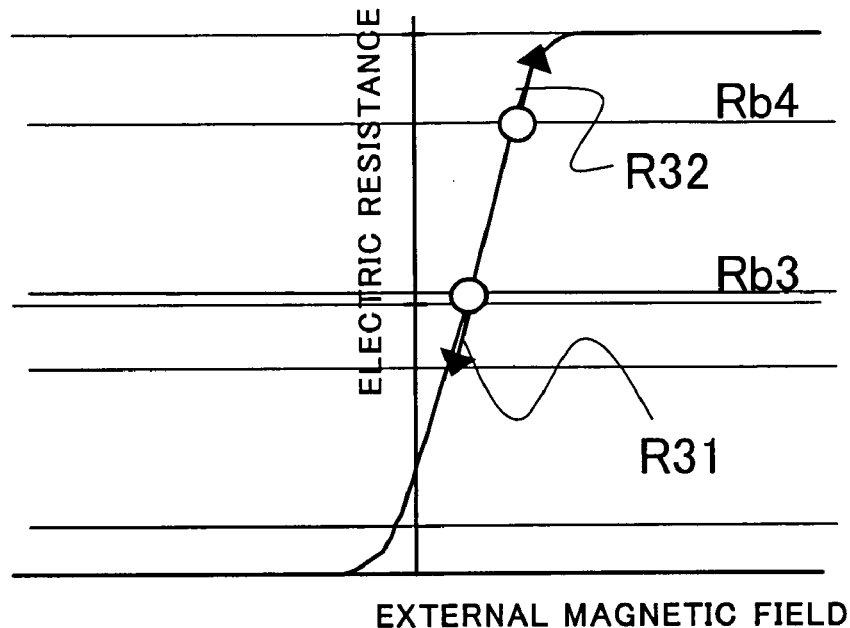
FIG. 7 is a graph showing the relationship between an electric resistance and an external magnetic field in the x axis direction of two other spin-valve giant magneto-resistive elements in EXAMPLE 1.
Figure 8:
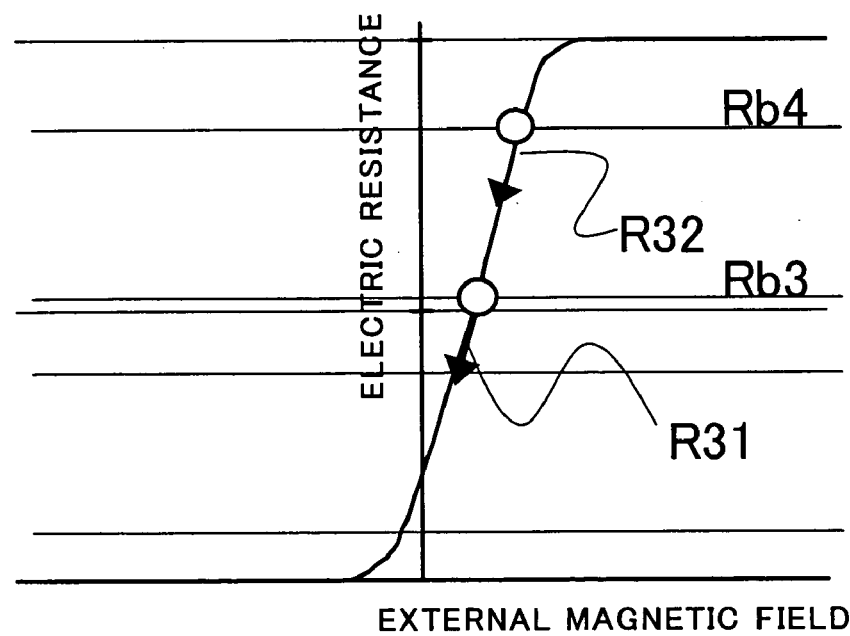
FIG. 8 is a graph showing the relationship between an electric resistance and an external magnetic field in the y axis direction of the same two spin-valve giant magneto-resistive elements as in FIG. 7 in EXAMPLE 1.

FIG. 7 is a graph showing the relationship of a resistance R31 of the spin-valve giant magneto-resistive element 31 and a resistance R32 of the spin-valve giant magneto-resistive element 32 to an external magnetic field intensity in the x axis direction. FIG. 8 is a graph showing the relationship of the resistance R31 of the spin-valve giant magneto-resistive element 31 and the resistance R32 of the spin-valve giant magneto-resistive element 32 to an external magnetic field intensity in the y axis direction. FIG. 7 and FIG. 8 show the resistance R31 of the spin-valve giant magneto-resistive element 31 as a resistance Rb3 at the time of applying a biasing magnetic field and the resistance R32 of the spin-valve giant magneto-resistive element 32 as a resistance Rb4 at the time of applying a biasing magnetic field. When the external magnetic field 40 of an intensity He is applied to the spin-valve giant magneto-resistive element 31 and the spin-valve giant magneto-resistive element 32 at an angle θ from the x axis, the x component (He·cosθ) of the external magnetic field 40 causes the resistance R31 of the spin-valve giant magneto-resistive element 31 to decrease, with the result that the resistance R31 varies from Rb3 as shown in FIG. 7, and as the y component (He·sinθ) of the external magnetic field 40 causes the resistance R31 of the spin-valve giant magneto-resistive element 31 to decrease, the resistance R31 varies from Rb3 as shown in FIG. 8. As the x component (He·cosθ) of the external magnetic field 40 causes the resistance R32 of the spin-valve giant magneto-resistive element 32 to increase, the resistance R32 varies from Rb4 as shown in FIG. 7, and as the y component (He·sinθ) of the external magnetic field 40 causes the resistance R32 the spin-valve giant magneto-resistive element 32 to decrease, the resistance R32 varies from Rb4 as shown in FIG. 8.

To sum up the foregoing, the resistance R31 of the spin-valve giant magneto-resistive element 31 and the resistance R32 of the spin-valve giant magneto-resistive element 32 can be expressed in the following equations, respectively:

$$R31 = Rb3 - \beta \cdot He \cdot \cos\theta - \beta \cdot He \cdot \sin\theta \quad (3)$$

$$R32 = Rb4 + \beta \cdot He \cdot \cos\theta - \beta \cdot He \cdot \sin\theta \quad (4)$$

As the magnetization of the pinned layer of the spin-valve giant magneto-resistive element 41 of the spin-valve giant magneto-resistive element pair 4 is fixed by an antiferromagnetic layer in the direction of broken arrow 30, it is outward in the longitudinal direction of the spin-valve giant magneto-resistive element 41. The free layer of the spin-valve giant magneto-resistive element 41 is magnetized outward in the longitudinal direction by applying an outward magnetic field by the plane coil in advance. Since the magnetization of the pinned layer is parallel to the magnetization of the free layer, the resistance of the spin-valve giant magneto-resistive elements 41 is in position "a" in FIG. 4. As the flow of a biasing DC current Ib of an appropriate amperage through the plane coil 1 clockwise causes a DC magnetic field to be applied to the spin-valve giant magneto-resistive element 41 in the direction of the y axis, the magnetization of the free layer inclines toward the direction of that DC magnetic field, and therefore its resistance slightly rises from position "a" toward position "b" in the graph of FIG. 4.

The pinned layer of the spin-valve giant magneto-resistive element 42 of the spin-valve giant magneto-resistive element pair 4 is magnetized outward in the widthwise direction of the spin-valve giant magneto-resistive element 42. The free layer of the spin-valve giant magneto-resistive element 42 is magnetized outward in the longitudinal direction by applying an outward magnetic field by the plane coil in advance. Since the magnetizing direction of the pinned layer and that of the free layer are perpendicular to each other, the resistance of the spin-valve giant magneto-resistive element 42 is in position "b" in FIG. 4. As the flow of a biasing DC current Ib of an appropriate amperage through the plane coil 1 clockwise causes a DC magnetic field to be applied to the spin-valve giant magneto-resistive element 42 in the direction of the y axis, the magnetization of the free layer inclines toward the direction of that DC magnetic field, and therefore its resistance slightly falls from position "b" toward position "a" in the graph of FIG. 4.

Figure 9:
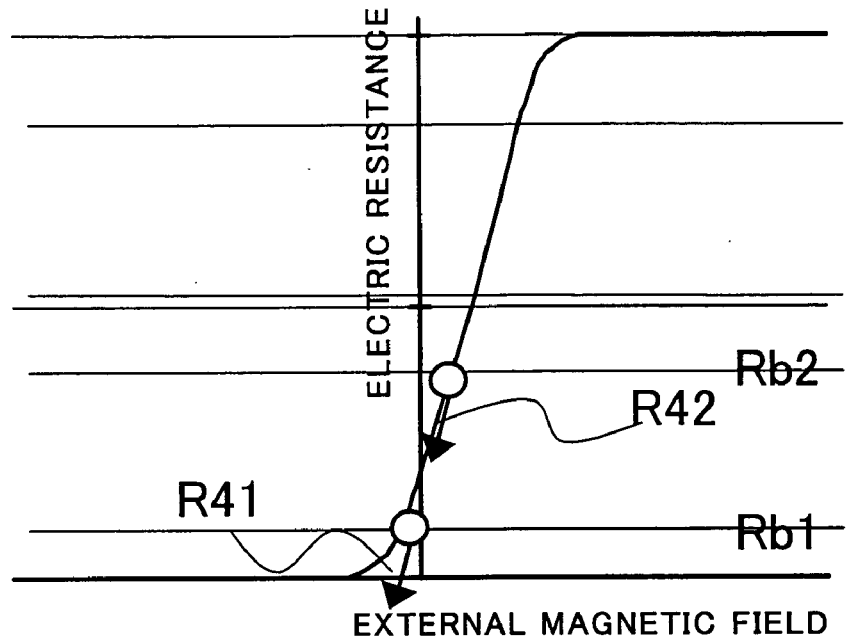
FIG. 9 is a graph showing the relationship between an electric resistance and an external magnetic field in the x axis direction of two still other spin-valve giant magneto-resistive elements in EXAMPLE 1.
Figure 10:
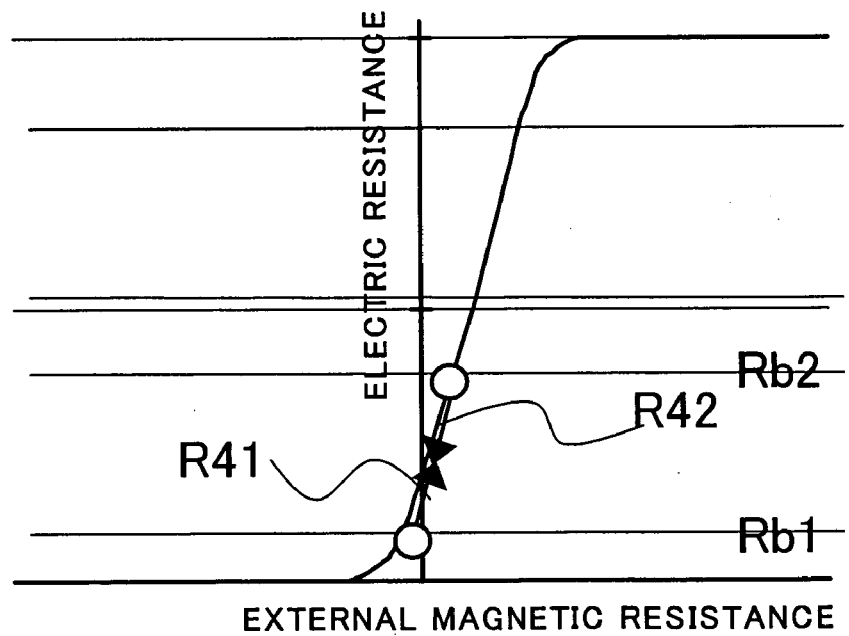
FIG. 10 is a graph showing the relationship between an electric resistance and an external magnetic field in the y axis direction of the same two spin-valve giant magneto-resistive elements as in FIG. 9 in EXAMPLE 1.

FIG. 9 is a graph showing the relationship of a resistance R41 of the spin-valve giant magneto-resistive element 41 and a resistance R42 of the spin-valve giant magneto-resistive element 42 to an external magnetic field intensity in the x axis direction. FIG. 10 is a graph showing the relationship of a resistance R41 of the spin-valve giant magneto-resistive element 41 and a resistance R42 of the spin-valve giant magneto-resistive element 42 to an external magnetic field intensity in the y axis direction. In FIG. 9 and FIG. 10, the resistance of the spin-valve giant magneto-resistive element 41 is a resistance Rb1 when a biasing magnetic field is applied to it and the resistance of the spin-valve giant magneto-resistive element 42 is a resistance Rb2 when a biasing magnetic field is applied to it. When the external magnetic field 40 of an intensity He is applied to the spin-valve giant magneto-resistive element 41 and the spin-valve giant magneto-resistive element 42 at an angle θ from the x axis, the x component (He·cosθ) of the external magnetic field 40 causes the resistance R41 of the spin-valve giant magneto-resistive element 41 to decrease, with the result that the resistance R41 varies from Rb1 as shown in FIG. 9, and as the y component (He·sinθ) of the external magnetic field 40 causes the resistance R41 of the spin-valve giant magneto-resistive element 41 to increase, the resistance R41 varies from Rb1 as shown in FIG. 10. As the x component (He·cosθ) of the external magnetic field 40 causes the resistance R42 of the spin-valve giant magneto-resistive element 42 to decrease, the resistance R42 varies from Rb2 as shown in FIG. 9, and as the y component (He·sinθ) of the external magnetic field 40 causes the resistance R42 of the spin-valve giant magneto-resistive element 42 to decrease, the resistance R42 varies from Rb2 as shown in FIG. 10.

To sum up the foregoing, the resistance R41 of the spin-valve giant magneto-resistive element 41 and the resistance R42 of the spin-valve giant magneto-resistive element 42 can be expressed in the following equations, respectively:

$$R41 = Rb1 - \beta \cdot He \cdot \cos\theta + \beta \cdot He \cdot \sin\theta \quad (5)$$

$$R42 = Rb2 - \beta \cdot He \cdot \cos\theta - \beta \cdot He \cdot \sin\theta \quad (6)$$

As the magnetization of the pinned layer of the spin-valve giant magneto-resistive element 52 of the spin-valve giant magneto-resistive element pair 5 is fixed by an antiferromagnetic layer in the direction of broken arrow 30, it is inward in the longitudinal direction of the spin-valve giant magneto-resistive element 52. The free layer of the spin-valve giant magneto-resistive element 52 is magnetized outward in the longitudinal direction by applying an outward magnetic field by the plane coil in advance. Since the magnetization of the pinned layer is antiparallel to the magnetization of the free layer, the resistance of the spin-valve giant magneto-resistive elements 52 is in position "c" in FIG. 4. As the flow of a biasing DC current Ib of an appropriate amperage through the plane coil 1 clockwise causes a DC magnetic field to be applied to the spin-valve giant magneto-resistive element 52 in the direction of the −y axis, the magnetization of the free layer inclines toward the direction of that DC magnetic field, and therefore its resistance slightly falls from position "c" toward position "b" in the graph of FIG. 4.

The magnetization of the pinned layer of the spin-valve giant magneto-resistive element 51 of the spin-valve giant magneto-resistive element pair 5 is inward in the widthwise direction of the spin-valve giant magneto-resistive element 51. The free layer of the spin-valve giant magneto-resistive element 51 is magnetized outward in the longitudinal direction by applying an outward magnetic field by the plane coil in advance. Since the magnetizing direction of the pinned layer and that of the free layer are perpendicular to each other, the resistance of the spin-valve giant magneto-resistive element 51 is in position "b" in FIG. 4. As the flow of a biasing DC current Ib of an appropriate amperage through the plane coil 1 clockwise causes a DC magnetic field to be applied to the spin-valve giant magneto-resistive element 51 in the direction of the −y axis, the magnetization of the free layer inclines toward the direction of that DC magnetic field, and therefore its resistance slightly rises from position "b" toward position "c" in the graph of FIG. 4.

Figure 11:
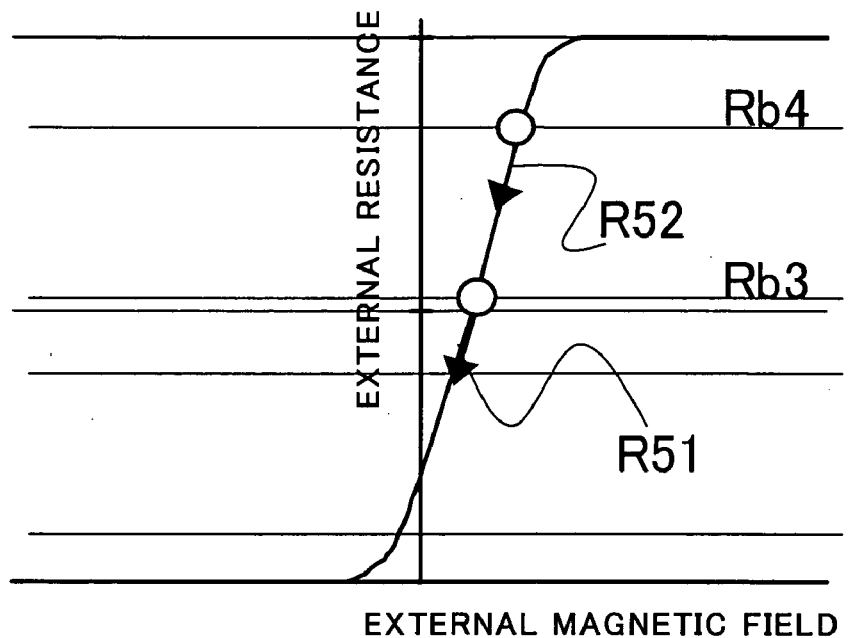
FIG. 11 is a graph showing the relationship between an electric resistance and an external magnetic field in the x axis direction of the remaining two spin-valve giant magneto-resistive elements in EXAMPLE 1.
Figure 12:
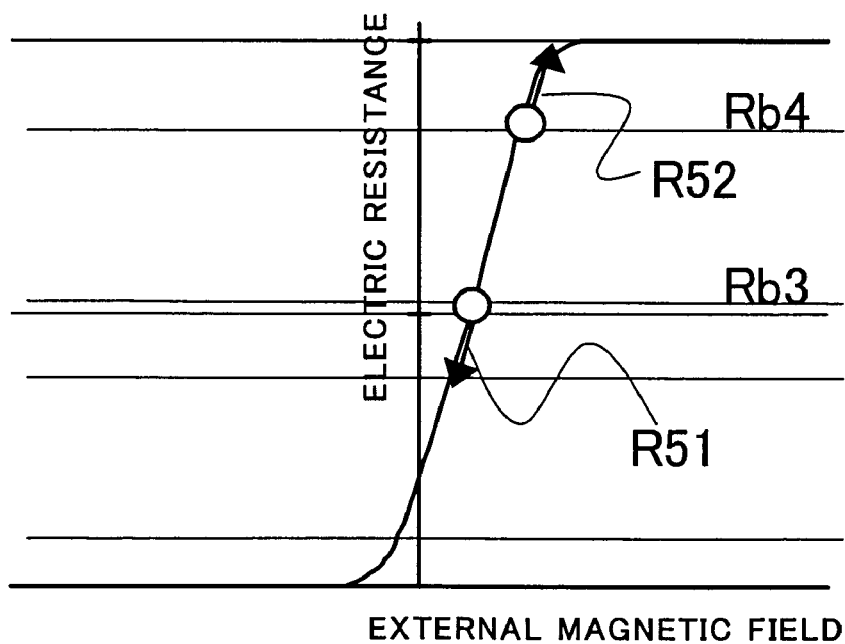
FIG. 12 is a graph showing the relationship between an electric resistance and an external magnetic field in the y axis direction of the same two spin-valve giant magneto-resistive elements as in FIG. 11 in EXAMPLE 1.

FIG. 11 is a graph showing the relationship of a resistance R51 of the spin-valve giant magneto-resistive element 51 and a resistance R52 of the spin-valve giant magneto-resistive element 52 to an external magnetic field intensity in the x axis direction. FIG. 12 is a graph showing the relationship of the resistance R51 of the spin-valve giant magneto-resistive element 51 and the resistance R52 of the spin-valve giant magneto-resistive element 52 to an external magnetic field intensity in the y axis direction. In FIG. 11 and FIG. 12, the resistance of the spin-valve giant magneto-resistive element 51 is a resistance Rb3 when a biasing magnetic field is applied to it and the resistance of the spin-valve giant magneto-resistive element 52 is a resistance Rb4 when a biasing magnetic field is applied to it. When the external magnetic field 40 of an intensity He is applied to the spin-valve giant magneto-resistive element 51 and the spin-valve giant magneto-resistive element 52 at an angle θ from the x axis, the x component (He·cosθ) of the external magnetic field 40 causes the resistance R51 of the spin-valve giant magneto-resistive element 51 to decrease, with the result that the resistance R51 varies from Rb3 as shown in FIG. 11, and as the y component (He·sinθ) of the external magnetic field 40 causes the resistance R51 of the spin-valve giant magneto-resistive element 51 to decrease, the resistance R51 varies from Rb3 as shown in FIG. 12. As the x component (He·cosθ) of the external magnetic field 40 causes the resistance R52 of the spin-valve giant magneto-resistive element 52 to decrease, the resistance R52 varies from Rb4 as shown in FIG. 11, and as the y component (He·sinθ) of the external magnetic field 40 causes the resistance R52 of the spin-valve giant magneto-resistive element 52 to decrease, the resistance R52 varies from Rb4 as shown in FIG. 12.

To sum up the foregoing, the resistance R51 of the spin-valve giant magneto-resistive element 51 and the resistance R52 of the spin-valve giant magneto-resistive element 52 can be expressed in the following equations, respectively:

$$R51 = Rb3 - \beta \cdot He \cdot \cos\theta - \beta \cdot He \cdot \sin\theta \quad (7)$$

$$R52 = Rb4 - \beta \cdot He \cdot \cos\theta + \beta \cdot He \cdot \sin\theta \quad (8)$$

The respective midpoint potentials Vx2 and Vx3 of the spin-valve giant magneto-resistive element pair 2 and the spin-valve giant magneto-resistive element pair 3 can be expressed as follows, derived from Equations (1) through (4):

$$Vx2 = Vcc \cdot R22/(R21 + R22)$$
$$= Vcc \cdot (Rb2 - \beta \cdot He \cdot \cos\theta - \beta \cdot He \cdot \sin\theta)/(Rb1 + Rb2)$$
$$Vx3 = Vcc \cdot R32/(R31 + R32)$$
$$= Vcc \cdot (Rb4 + \beta \cdot He \cdot \cos\theta - \beta \cdot He \cdot \sin\theta)/(Rb3 + Rb4)$$

To represent the difference in midpoint potential between the spin-valve giant magneto-resistive element pair 2 and the spin-valve giant magneto-resistive element pair 3 by Vx(+) when a biasing current Ib is caused to flow through the plane coil 1 clockwise, the difference Vx(+) can be expressed in the following equation:

$$Vx(+) = Vx2 - Vx3$$
$$= Vcc \cdot \{(Rb2 \cdot (Rb3 + Rb4) - Rb4 \cdot (Rb1 + Rb2))/$$
$$((Rb1 + Rb2) \cdot (Rb3 + Rb4)) - \beta \cdot He \cdot \cos\theta \cdot$$
$$(Rb1 + Rb2 + Rb3 + Rb4)/((Rb1 + Rb2) \cdot$$
$$(Rb3 + Rb4))\}$$

In the equation above, Vcc·(Rb2 (Rb3+Rb4)−Rb4·(Rb1+Rb2))/((Rb1+Rb2)·(Rb3+Rb4)) does not vary with the direction or the magnitude of an external magnetic field. Therefore, to represent it by a constant C, the difference Vx(+) in midpoint potential can be rewritten as follows:

$$V'x(+) = Vx(+) - C \quad (9)$$
$$= -Vcc \cdot \beta \cdot He \cdot \cos\theta \cdot (Rb1 + Rb2 + Rb3 + Rb4)/$$
$$((Rb1 + Rb2) \cdot (Rb3 + Rb4))$$

The respective midpoint potentials Vy4 and Vy5 of the spin-valve giant magneto-resistive element pair 4 and the spin-valve giant magneto-resistive element pair 5 can be expressed as follows, derived from Equations (5) through (8):

$$Vy4 = Vcc \cdot R42/(R41 + R42)$$
$$= Vcc \cdot (Rb2 - \beta \cdot He \cdot \cos\theta - \beta \cdot He \cdot \sin\theta)/(Rb1 + Rb2)$$
$$Vy5 = Vcc \cdot R52/(R51 + R52)$$
$$= Vcc \cdot (Rb4 - \beta \cdot He \cdot \cos\theta + \beta \cdot He \cdot \sin\theta)/(Rb3 + Rb4)$$

To represent the difference in midpoint potential between the spin-valve giant magneto-resistive element pair 4 and the spin-valve giant magneto-resistive element pair 5 by Vy(+) when a biasing current Ib is caused to flow through the plane coil 1 clockwise, the difference Vy(+) can be expressed in the following equation:

$$Vy(+) = Vy4 - Vy5$$
$$= Vcc \cdot \{(Rb2 \cdot (Rb3 + Rb4) - Rb4 \cdot (Rb1 + Rb2))/$$
$$((Rb1 + Rb2) \cdot (Rb3 + Rb4)) + \beta \cdot He \cdot \sin\theta \cdot$$
$$(Rb1 + Rb2 + Rb3 + Rb4)/((Rb1 + Rb2) \cdot$$
$$(Rb3 + Rb4))\}$$

In the equation above, Vcc·(Rb2·(Rb3+Rb4)−Rb4·(Rb1+Rb2))/((Rb1+Rb2)·(Rb3+Rb4)) does not vary with the direction or the magnitude of an external magnetic field. Therefore, to represent it by a constant C, the difference Vy(+) in midpoint potential can be rewritten as follows:

$$V'y(+) = Vy(+) - C \quad (10)$$
$$= Vcc \cdot \beta \cdot He \cdot \sin\theta \cdot (Rb1 + Rb2 + Rb3 + Rb4)/$$
$$((Rb1 + Rb2) \cdot (Rb3 + Rb4))$$

The angle θ at which the external magnetic field is expressed as follows, derived from Equations (9) and (10):

$$\theta = -\tan^{-1}(V'y(+)/V'x(+))$$

Therefore, the angle θ at which the external magnetic field is applied can be measured with the azimuth meter of EXAMPLE 1.

EXAMPLE 2

Figure 13:
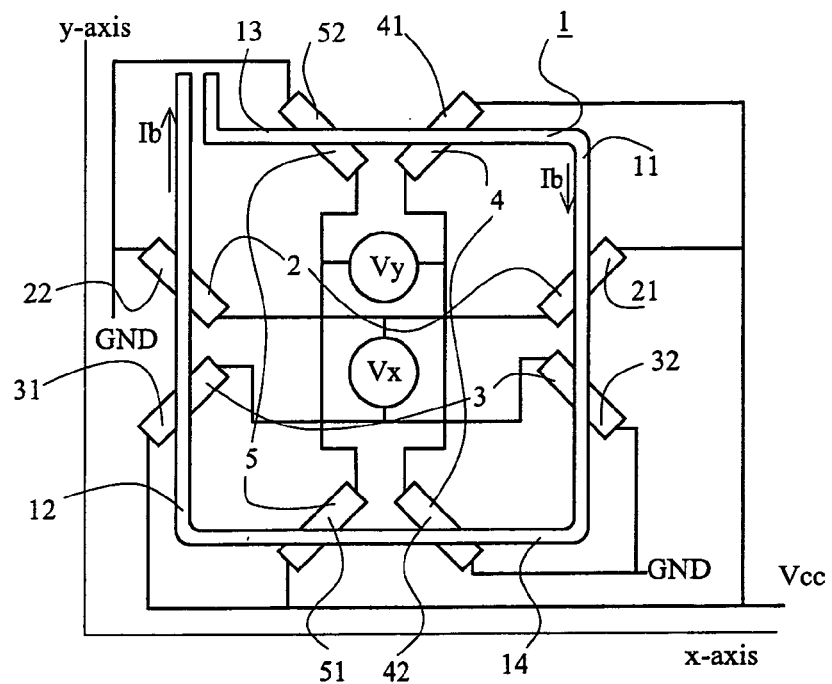
FIG. 13 is a circuit diagram of an azimuth meter of EXAMPLE 2 of the invention.
Figure 14:
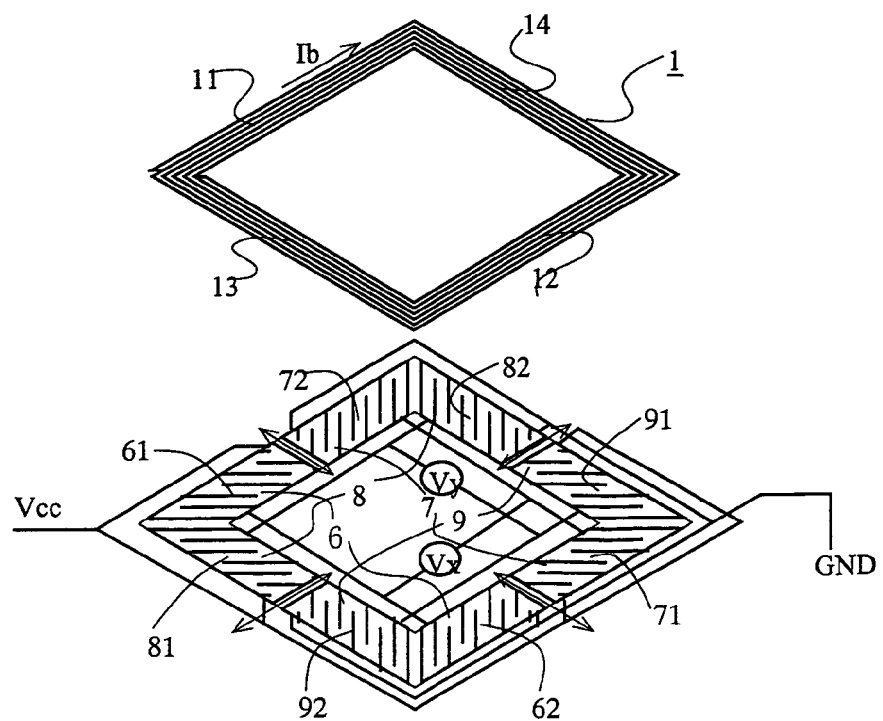
FIG. 14 is an explanatory exploded perspective view of the azimuth meter disclosed in the U.S. Patent.

An azimuth meter of EXAMPLE 2 of the present invention will be shown in FIG. 13 in a form of a circuit diagram. In this EXAMPLE, a longitudinal direction of one spin-valve giant magneto-resistive element of each spin-valve giant magneto-resistive element pair crosses only one of a pair of opposed sides of a plane coil 1 at substantially 45 degrees. Also, a longitudinal direction of the other spin-valve giant magneto-resistive element of each spin-valve giant magneto-resistive element pair crosses only the other of the pair of the opposed sides at substantially 45 degrees. Thus a spin-valve giant magneto-resistive element 21 that is one of a spin-valve giant magneto-resistive element pair 2 crosses one side 11 of the plane coil 1, and the other spin-valve giant magneto-resistive element 22 of the pair 2 crosses a side 12 opposed thereto. A spin-valve giant magneto-resistive element 31 that is one of a spin-valve giant magneto-resistive element pair 3 crosses the side 12 of the plane coil 1, while the other spin-valve giant magneto-resistive element 32 of the pair 3 crosses the side 11 opposed thereto. A spin-valve giant magneto-resistive element 41 that is one of a paired spin-valve giant magneto-resistive element pair 4 crosses a side 13 of the plane coil 1, while the other spin-valve giant magneto-resistive element 42 of the pair 4 crosses a side 14 opposed thereto. A spin-valve giant magneto-resistive element 51 that is one of a spin-valve giant magneto-resistive element pair 5 crosses the side 14 of the plane coil 1, while the other spin-valve giant magneto-resistive element 52 of the pair 5 crosses the side 13 opposed thereto. The directions of the magnetization of the pinned layers of the spin-valve giant magneto-resistive element pairs and the connection relationships between the spin-valve giant magneto-resistive element pairs are the same as those in EXAMPLE 1. This azimuth meter too, like that of EXAMPLE 1, can measure an angle of an external magnetic field.

As is evident from EXAMPLES 1 and 2 of the present invention, either azimuth meter according to the invention can measure a direction of a magnetic field applied from outside. Since the pinned layers of all the spin-valve giant magneto-resistive elements in the azimuth meter are magnetized in the same direction, those spin-valve giant magneto-resistive elements can be simultaneously fabricated in a single process. The surface resistivity (sheet resistivity) of the spin-valve giant magneto-resistive elements is approximately 16 ohm/square, far greater than 3.1 ohm/square of isotropic giant magneto-resistive elements or 6.8 ohm/square of anisotropic magneto-resistive elements, contributing to power saving in azimuth measurement.

What is claimed is:

1. An azimuth meter comprising a plane coil having two pairs of opposed sides which are at least partially parallel to each other, the pairs being perpendicular to each other; and
two pairs, per pair of the opposed sides of the plane coil, of spin-valve giant magneto-resistive elements positioned on the same side of a plane of the plane coil and on a plane parallel and close to the plane of the plane coil, wherein:
each of the spin-valve giant magneto-resistive elements is a multi-layered thin film formed by sandwiching a nonmagnetic layer between a pinned layer made of a ferromagnetic substance magnetically coupled with an antiferromagnetic layer made of an antiferromagnetic substance and a free layer made of a ferromagnetic substance, the multi-layered thin film having a shape whose widthwise dimension is sufficiently small relative to a longitudinal dimension thereof,
a longitudinal direction of one spin-valve giant magneto-resistive element of each pair of the spin-valve giant magneto-resistive element pairs and that of the other spin-valve giant magneto-resistive element of the pair orthogonally cross each other, the pinned layer of the one spin-valve giant magneto-resistive element is magnetized in its longitudinal direction and the pinned layer of the other spin-valve giant magneto-resistive element is magnetized in the same direction as the pinned layer of the one spin-valve giant magneto-resistive element;
the longitudinal directions of the two spin-valve giant magneto-resistive elements constituting each pair of the spin-valve giant magneto-resistive element pairs cross only a respective side or only the same side of the pair of the opposed sides of the plane coil at substantially 45 degrees; and
the two spin-valve giant magneto-resistive elements of each pair of the spin-valve giant magneto-resistive element pairs are connected to each other at one end of each of the two spin-valve giant magneto-resistive elements, and a voltage for measurement is applied between the other ends of the two spin-valve giant magneto-resistive elements to enable a midpoint potential to be taken out of the one end.

2. An azimuth meter according to claim 1, wherein the longitudinal directions of the two spin-valve giant magneto-resistive elements constituting each pair of the spin-valve giant magneto-resistive element pairs cross only the same side of the pair of the opposed sides of the plane coil at substantially 45 degrees.

3. An azimuth meter according to claim 2, further comprising a power source to supply the plane coil with a sufficient DC current to apply DC magnetic fields of such a magnitude as to saturate a magnetization of the free layers of the spin-valve giant magneto-resistive elements in the longitudinal direction, and to supply the plane coil with a DC current to apply to the spin-valve giant magneto-resistive elements DC magnetic fields of a predetermined magnitude smaller than the DC magnetic fields for saturation.

4. An azimuth meter according to claim 3, further comprising an arithmetic unit, which extracts a difference in midpoint potential between two spin-valve giant magneto-resistive element pairs crossing one pair of the opposed sides of the plane coil and a difference in midpoint potential between two spin-valve giant magneto-resistive element pairs crossing the other pair of the opposed sides while the DC magnetic fields of the predetermined magnitude are being applied to the spin-valve giant magneto-resistive elements, and determines an azimuth of an external magnetic field on the basis of the two differences in midpoint potential.

5. An azimuth meter according to claim 1, wherein the longitudinal directions of two spin-valve giant magneto-resistive elements constituting each pair of the spin-valve giant magneto-resistive element pairs cross only a respective side of the pair of the opposed sides of the plane coil at substantially 45 degrees.

6. An azimuth meter according to claim 5, further comprising a power source to supply the plane coil with a sufficient DC current to apply DC magnetic fields of such a magnitude as to saturate a magnetization of the free layers of the spin-valve giant magneto-resistive elements in the longitudinal direction, and to supply the plane coil with a DC current to apply to the spin-valve giant magneto-resistive elements DC magnetic fields of a predetermined magnitude smaller than the DC magnetic fields for saturation.

7. An azimuth meter according to claim 6, further comprising an arithmetic unit, which extracts a difference in midpoint potential between two spin-valve giant magneto-resistive element pairs crossing one pair of the opposed sides of the plane coil and a difference in midpoint potential between two spin-valve giant magneto-resistive element pairs crossing the other pair of the opposed sides while the DC magnetic fields of the predetermined magnitude are being applied to the spin-valve giant magneto-resistive elements, and determines an azimuth of an external magnetic field on the basis of the two differences in midpoint potential.

8. An azimuth meter according to claim 1, further comprising a power source to supply the plane coil with a sufficient DC current to apply DC magnetic fields of such a magnitude as to saturate a magnetization of the free layers of the spin-valve giant magneto-resistive elements in the longitudinal direction, and to supply the plane coil with a DC current to apply to the spin-valve giant magneto-resistive elements DC magnetic fields of a predetermined magnitude smaller than the DC magnetic fields for saturation.

9. An azimuth meter according to claim 8, further comprising an arithmetic unit, which extracts a difference in midpoint potential between two of spin-valve giant magneto-resistive element pairs crossing one pair of the opposed sides of the plane coil and a difference in midpoint potential between two spin-valve giant magneto-resistive element pairs crossing the other pair of the opposed sides while the DC magnetic fields of the predetermined magnitude are being applied to the spin-valve giant magneto-resistive elements, and determines an azimuth of an external magnetic field on the basis of the two differences in midpoint potential.

* * * * *